United States Patent
Beecher et al.

(10) Patent No.: US 9,733,706 B2
(45) Date of Patent: Aug. 15, 2017

(54) APPARATUS AND ASSOCIATED METHODS FOR TOUCHSCREEN DISPLAYS

(75) Inventors: Paul Beecher, Cambridge (GB); Chris Bower, Ely (GB); Zoran Radivojevic, Cambridge (GB); Piers Andrew, Cambridge (GB); Darryl Cotton, Cambridge (GB); Samiul Haque, Cambridge (GB); Tapani Ryhanen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 13/332,902

(22) Filed: Dec. 21, 2011

(65) Prior Publication Data

US 2013/0106765 A1  May 2, 2013

Related U.S. Application Data

(63) Continuation-in-part of application No. 13/281,776, filed on Oct. 26, 2011.

(51) Int. Cl.
*G06F 3/044* (2006.01)
*G06F 3/01* (2006.01)
*H03K 17/96* (2006.01)
*G06F 3/041* (2006.01)

(52) U.S. Cl.
CPC .............. *G06F 3/016* (2013.01); *G06F 3/044* (2013.01); *G06F 3/0416* (2013.01); *H03K 17/962* (2013.01); *H03K 2217/96062* (2013.01)

(58) Field of Classification Search
CPC ......... G06F 3/016; G08B 6/00; G09B 21/003; G09B 21/004; B06B 1/06; B06B 1/00; B06B 1/0688; B06B 1/0692; B06B 1/0696
See application file for complete search history.

(56) References Cited

U.S. PATENT DOCUMENTS

| | | | |
|---|---|---|---|
| 5,457,289 A | 10/1995 | Huang et al. | 178/20 |
| 5,543,588 A | 8/1996 | Bisset et al. | 178/18.06 |
| 2004/0155871 A1 | 8/2004 | Perski et al. | 345/174 |
| 2007/0171211 A1 | 7/2007 | Perski et al. | 345/173 |
| 2007/0222762 A1 | 9/2007 | Van Delden et al. | 345/173 |

(Continued)

FOREIGN PATENT DOCUMENTS

| | | |
|---|---|---|
| EP | 2112576 A1 | 10/2009 |
| EP | 2354901 A1 | 8/2011 |

(Continued)

OTHER PUBLICATIONS

Reverter, et al., "Stability and Accuracy of Active Shielding for Grounded Capacitive Sensors", Institute of Physics Publishing, (Sep. 28, 2006), (pp. 2884-2890).

(Continued)

*Primary Examiner* — Lisa Landis
(74) *Attorney, Agent, or Firm* — Harrington & Smith

(57) ABSTRACT

An apparatus including at least one processor and at least one memory including computer program code, the at least one memory and the computer program code configured to, with the at least one processor, cause the apparatus at least to provide a first state or a second state for an electrode, wherein in the first state, the electrode is configured for use in the detection of touch input, and in the second state, the electrode is configured for use in the provision of haptic feedback.

21 Claims, 9 Drawing Sheets

(56) References Cited

U.S. PATENT DOCUMENTS

| | | | |
|---|---|---|---|
| 2008/0158176 A1 | 7/2008 | Land | 345/173 |
| 2008/0158178 A1 | 7/2008 | Hotelling et al. | 345/173 |
| 2010/0013791 A1 | 1/2010 | Haga et al. | 345/174 |
| 2010/0085169 A1* | 4/2010 | Poupyrev | G06F 3/03543 340/407.2 |
| 2010/0152794 A1 | 6/2010 | Radivojevic et al. | 607/2 |
| 2010/0156795 A1 | 6/2010 | Kim et al. | 345/168 |
| 2010/0200309 A1 | 8/2010 | Yilmaz et al. | 178/18.03 |
| 2010/0201650 A1 | 8/2010 | Son | 345/174 |
| 2010/0252335 A1 | 10/2010 | Orsley | 178/18.03 |
| 2010/0259503 A1 | 10/2010 | Yanase et al. | 345/174 |
| 2010/0302182 A1* | 12/2010 | Wei | G06F 3/044 345/173 |
| 2010/0309162 A1 | 12/2010 | Nakanishi et al. | 345/174 |
| 2010/0321328 A1 | 12/2010 | Chang et al. | 345/174 |
| 2011/0074609 A1 | 3/2011 | Lin | 341/33 |
| 2011/0074733 A1 | 3/2011 | Mäkinen et al. | 345/174 |
| 2011/0109588 A1* | 5/2011 | Makinen | G09B 21/003 345/174 |
| 2011/0148435 A1* | 6/2011 | Schwartz | G06F 3/0416 324/658 |
| 2011/0148809 A1* | 6/2011 | Kanehira | G06F 3/044 345/174 |
| 2011/0156930 A1 | 6/2011 | Chen et al. | 341/33 |
| 2011/0254799 A1* | 10/2011 | Makinen et al. | 345/173 |
| 2011/0298758 A1* | 12/2011 | Hsieh | G06F 3/016 345/177 |
| 2012/0075221 A1 | 3/2012 | Yasuda | 345/173 |
| 2012/0194466 A1 | 8/2012 | Posamentier | 345/174 |
| 2012/0274599 A1* | 11/2012 | Schediwy | 345/174 |

FOREIGN PATENT DOCUMENTS

| | | |
|---|---|---|
| EP | 2482164 A1 | 8/2012 |
| GB | 2462112 A | 1/2010 |
| GB | 2478765 A | 9/2011 |
| WO | WO-2009056784 A1 | 5/2009 |

OTHER PUBLICATIONS

AD7I42, "Theory of Operation", (2007), (5 pages).
AD7147, Analog Services, "CapTouch Programmable Controller for Single-Electrode Capacitance Sensors", (2007), (72 pages).

\* cited by examiner

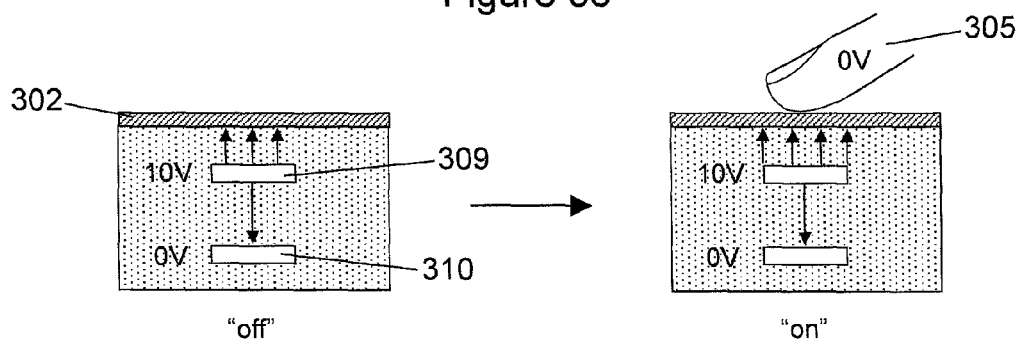
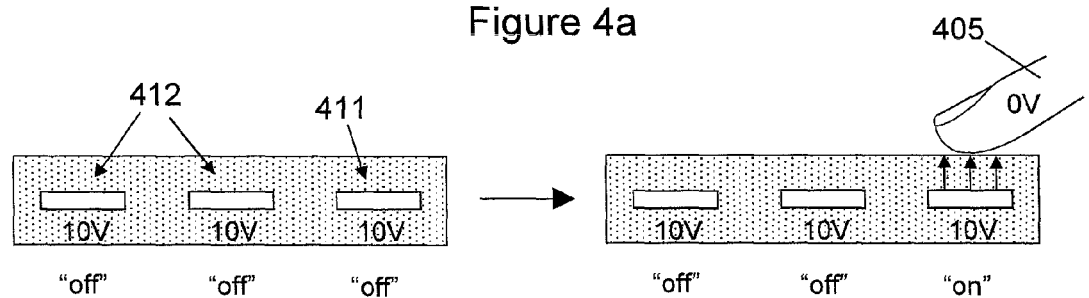
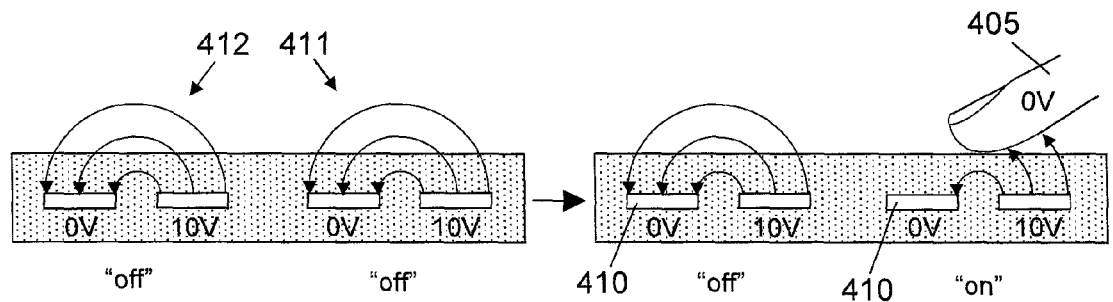

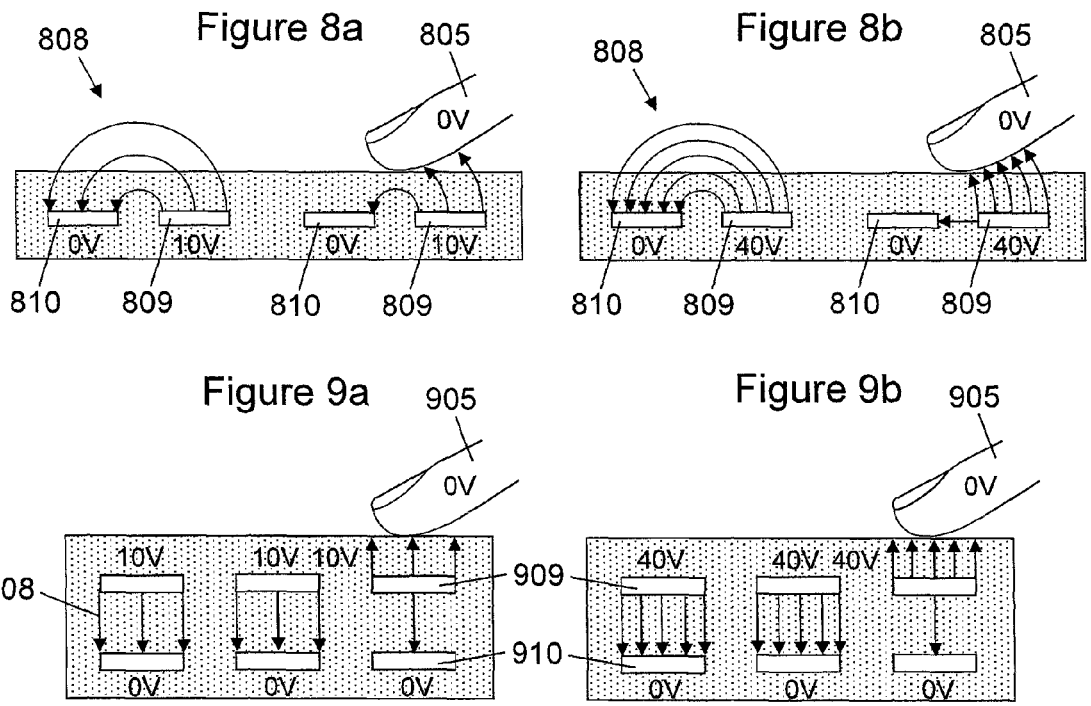
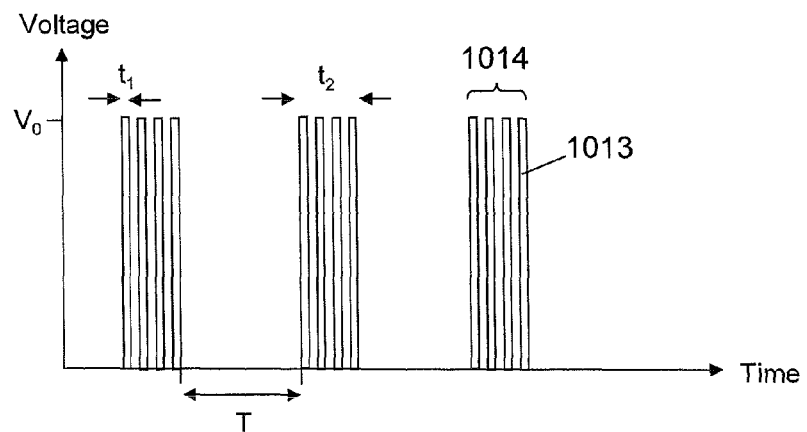

1627 — Provide a first or second state for an electrode

1628 — Detect touch input or provide haptic feedback, respectively

1729

APPARATUS AND ASSOCIATED METHODS FOR TOUCHSCREEN DISPLAYS

CROSS-REFERENCE TO A RELATED PATENT APPLICATION

This patent application is a continuation-in-part of U.S. patent application Ser. No. 13/281,776, filed Oct. 26, 2011.

TECHNICAL FIELD

The present disclosure relates to the field of touchscreen displays associated methods and apparatus, and in particular concerns an apparatus configured to provide a first or second state for an electrode such that the electrode can function either as a capacitive touch sensor or as an electrotactile element. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multi-media Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), down-loading/sending of data functions, image capture function (e.g. using a (e.g. in-built) digital camera), and gaming functions.

BACKGROUND

In touch user interfaces, a capacitive sensing matrix for touch detection is gaining greater adherence than traditional resistive touchscreen solutions. Neither technology, however, incorporates haptic feedback. There are several emerging technologies aiming to introduce haptic feedback without mechanically moving parts. One of these is an electrotactile surface which takes advantage of capacitive coupling to the user's skin to create a variable frictional force on the touchscreen panel. However, combining capacitive sensing and haptic feedback in the same electronic display is a technical challenge.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising at least one processor and at least one memory including computer program code, the at least one memory and the computer program code configured to, with the at least one processor, cause the apparatus at least to provide a first state or a second state for an electrode, wherein in the first state, the electrode is configured for use in the detection of touch input, and in the second state, the electrode is configured for use in the provision of haptic feedback.

In the first state, the electrode may serve as part of a capacitive touch sensor. The term "sensor" may be taken to mean a single node of a capacitive sensor array. The apparatus may be configured to provide the first state by applying a potential to the electrode and monitoring the capacitance associated with the capacitive touch sensor.

In one embodiment, the electrode may serve as part of a self-capacitive touch sensor. In this embodiment, the apparatus may be configured to provide the first state by applying a potential to the electrode and monitoring the capacitance of the electrode.

In another embodiment, the electrode may serve as a transmitter electrode of a horizontally-arranged or vertically-arranged mutually-capacitive touch sensor. In this embodiment, the apparatus may be configured to provide the first state by applying a potential to the transmitter electrode and monitoring the capacitance of a receiver electrode of the mutually-capacitive touch sensor.

In the first state, the electrode may be configured to couple capacitively to a stylus when said stylus is in proximity to the electrode. The term "stylus" may be taken to mean any object which is capable of holding electrical charge and which can be used to provide a touch input. The stylus may be made from an electrically conductive material or a dielectric material. The stylus may be a user of the apparatus (e.g. a user's finger), a conventional input stylus (e.g. a stylus as used with PDAs and the like), or a glove worn by a user of the apparatus (e.g. a glove comprising fingertips configured to hold electrical charge).

Capacitive coupling between the electrode and the stylus may be configured to generate a touch input signal to enable detection of a touch input. The stylus may form a capacitor with the electrode when the stylus is in proximity to the electrode. Capacitive coupling between the electrode and the stylus may be configured to cause a variation (increase or decrease depending on the stylus material) in the capacitance of the electrode. The variation in capacitance may be between 1 fF and 5 pF.

The electrode may be a transmitter electrode configured to generate an electric field between itself and a receiver electrode. The stylus may interfere with the electric field when the stylus is in proximity to the transmitter electrode. Capacitive coupling between the transmitter electrode and the stylus may cause a variation (increase or decrease depending on the stylus material) in the capacitance of the receiver electrode. The variation in capacitance may be between 1 fF and 5 pF.

The apparatus may be configured to provide the second state by applying a periodic potential to the electrode and controlling one or more of the amplitude, frequency, duration and polarity of the periodic potential.

In the second state, the electrode may function as an electrotactile element. The term "element" may be taken to mean a conductive electrode of an electrotactile system. In the second state, the electrode may be configured to couple capacitively to a stylus when said stylus is in proximity to the electrode. Capacitive coupling between the electrode and the stylus may be configured to provide haptic feedback.

The apparatus may be configured to discharge the electrode between providing the first state and providing the second state, and vice versa.

The apparatus may be configured to provide the second state when haptic feedback is required, and provide the first state when haptic feedback is not required. The apparatus may be configured to provide the second state in response to a touch input being detected to provide haptic feedback associated with the touch input. The apparatus may be configured to repeatedly switch between providing the first state and providing the second state during a period when touch input is required to be detected. The apparatus may be configured to repeatedly switch between providing the first state and providing the second state during a period when haptic feedback is required to be provided.

The apparatus may be configured to switch between providing the first state and providing the second state using one or more switches. In the first state, the one or more switches may connect the electrode to a sensor module. In the second state, the one or more switches connect the electrode to an electrotactile module. The sensor module may comprise one or more of a sensor power supply, a sensor control circuit and a sensor measurement circuit. The electrotactile module may comprise one or more of an electrotactile power supply, an electrotactile control circuit and a stylus ground.

The apparatus may be configured to provide a first state or a second state for a plurality of electrodes. In the first state, the electrodes may be configured for use in the detection of touch input. In the second state, the electrodes may be configured for use in the provision of haptic feedback. The apparatus may be configured to provide the state for one or more electrodes independently of the other electrodes.

The apparatus may comprise the electrode. The electrode may be made from one or more of the following materials: gold, silver, copper, carbon, graphene, zinc oxide, indium tin oxide, and vanadium oxide (but is not limited to these materials). The electrode may be formed by the junction of two or more intersecting strips of material.

The apparatus may comprise an electrically insulating material on top of the electrode. The electrically insulating material may have a thickness of 1 mm or less. The upper surface area of the electrode may be chosen such that the variation in capacitance caused by the capacitive coupling between the electrode and stylus is detectable regardless of the thickness of the electrically insulating material.

The apparatus may comprise a plurality of electrodes. The spacing between adjacent electrodes may be at least 1 mm. The electrodes may be formed as a mesh of material or as a plurality of intersecting strips of material. The mesh and/or intersecting strips of material may be formed as one or more of a thin film and a network of nanowires/nanotubes/nanoribbons (e.g. silver, carbon, zinc oxide or graphene nanowires/nanotubes/nanoribbons).

The apparatus may be one of the following: an electronic device, a portable electronic device, a portable telecommunications device, a touchscreen display for any of the aforementioned devices, and a module for any of the aforementioned devices.

According to a further aspect, there is provided a device comprising any apparatus described herein.

According to a further aspect, there is provided an apparatus comprising means for providing a first state or a second state for an electrode, wherein in the first state, the electrode is configured for use in the detection of touch input, and in the second state, the electrode is configured for use in the provision of haptic feedback.

The means for providing a first state or a second state may comprise means for applying a potential to the electrode and means for monitoring the capacitance associated with the capacitive touch sensor.

The means for providing a first state or a second state may comprise means for applying a periodic potential to the electrode and means for controlling one or more of the amplitude, frequency, duration and polarity of the periodic potential.

The apparatus may comprise means for switching between providing the first state and providing the second state.

According to a further aspect, there is provided a method, the method comprising:
providing a first state or a second state for an electrode, wherein in the first state, the electrode is configured for use in the detection of touch input, and in the second state, the electrode is configured for use in the provision of haptic feedback.

The method may comprise detecting a touch input using the electrode when the electrode is in the first state. The method may comprise providing haptic feedback using the electrode when the electrode is in the second state.

The steps of any method disclosed herein do not have to be performed in the exact order disclosed, unless explicitly stated or understood by the skilled person.

According to a further aspect, there is provided a computer program, recorded on a carrier, the computer program comprising computer code configured to perform any method described herein.

The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described example embodiments.

The above summary is intended to be merely exemplary and non-limiting.

BRIEF DESCRIPTION OF THE FIGS.

A description is now given, by way of example only, with reference to the accompanying drawings, in which:

FIG. 3c shows how the presence of an electrotactile layer can hinder the detection of a touch input by a vertically-arranged mutually-capacitive touch sensor;

FIG. 4a shows a plurality of self-capacitive touch sensors;

FIG. 4b shows a plurality of horizontally-arranged mutually-capacitive touch sensors;

FIG. 8a shows an array of electrodes functioning as horizontally-arranged mutually-capacitive touch sensors;

FIG. 8b shows the array of electrodes of FIG. 8a functioning as electrotactile elements;

FIG. 9a shows an array of electrodes functioning as vertically-arranged mutually-capacitive touch sensors;

FIG. 9b shows the array of electrodes of FIG. 9a functioning as electrotactile elements;

FIG. 10 shows a typical electrotactile signal for providing haptic feedback.

DESCRIPTION OF SPECIFIC ASPECTS/EMBODIMENTS

Haptic technology is a tactile feedback technology which takes advantage of a user's sense of touch by applying forces, vibrations, and/or motions upon the user to convey information. In the past, tactile feedback has been used to assist in the creation and control of virtual objects (i.e. objects existing only in a computer simulation), and to enhance control of remote machines and devices.

More recently, however, haptic technology has been used in portable electronic devices to supplement visual content. For example, some devices use haptic technology to produce vibrations in response to touch. This may be combined with touch-sensitive screens, where the vibrations can be used to acknowledge selection of on-screen content by the user. In other devices, vibrations have been used to direct a user to a particular on-screen feature, and even to create a tactile representation of an image to enable perception of displayed content with reduced cognitive effort.

As mentioned in the background section, one method of generating vibrations in the skin is to incorporate an electrotactile system in the display of an electronic device. This technology is based on electrovibration, in which the mechanoreceptors are deceived into perceiving texture when a fingertip is swiped across an insulating layer above an electrical conductor carrying an alternating potential. This effect is due to the varying electrostatic attraction between the conductor and the deeper, liquid-rich conducting layers of the skin—an effect which changes the perceived dynamic function.

Figure 1A:
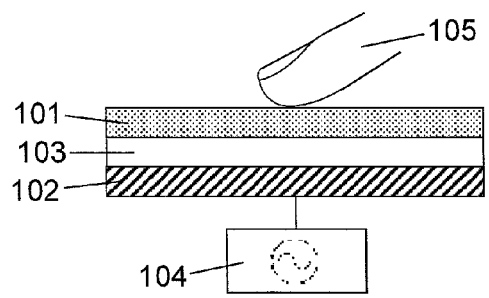
FIG. 1a shows one embodiment of a device configured to provide haptic feedback.

FIG. 1a shows a device incorporating an electrotactile system. The device comprises an electronic display 101, an electrically conducting layer 102 (referred to herein as the electrotactile layer), an electrically insulating layer 103 and a power supply 104, the electrically insulating layer 103 positioned between a user 105 of the device and the electrotactile layer 102. The power supply 104 is configured to charge the electrotactile layer 102, and the electrically insulating layer 103 is configured to prevent a flow of current between the electrotactile layer 102 and the skin of the user 105 when the user 105 is proximate to the electrotactile layer 102. The electrically insulating layer 103 may be unnecessary, however, if the electronic display 101 is electrically insulating.

The electrotactile layer 102 is configured to allow establishment of an electric field between itself and the user 105. To achieve this, the power supply 104 charges the electrotactile layer 102, and the charge on the electrotactile layer 102 induces charges of opposite polarity on the skin of the user 105. The build up of charge on the electrotactile layer 102 and the user 105 is what forms the electric field. This may be visualised as a (dynamic) capacitor, where the electrotactile layer 102 is the first electrode and the user 105 is the second electrode, the first and second electrodes separated by an electrical insulator 103. The electrostatic force generated by the charge on the electrotactile layer 102 attracts the charge on the user 105 causing movement of the user's skin.

To generate vibration in the skin of the user 105, the power supply 104 varies the magnitude (and/or polarity) of charge on the electrotactile layer 102 periodically. The variation of charge causes variations in electric field strength (and/or direction) which in turn causes vibrations in the skin. By controlling the electric field strength, it is possible to tune the frequency and amplitude of the skin vibrations to a specific receptor. Unlike some other types of haptic feedback technology, physical contact between the user 105 and the device is not required because the electrotactile layer 102 couples capacitively to the user's skin, or any other stylus, via the electric field (i.e. action at a distance). The electrotactile layer may be divided into a plurality of individually controllable segments. This configuration allows one segment to provide a different amplitude and/or frequency of vibration than another segment such that the haptic feedback is different at different regions of the display.

Figure 1B:
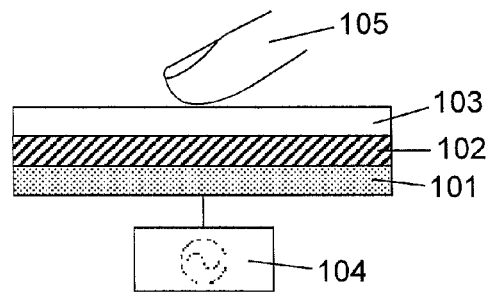
FIG. 1b shows another embodiment of a device configured to provide haptic feedback.

In an alternative configuration (shown in FIG. 1b), the electronic display 101 is located below the electrotactile layer 102 and electrically insulating layer 103. This configuration reduces the distance between the electrotactile layer 102 and the user 105, which increases the capacitance. This arrangement therefore allows a smaller potential to be applied to the electrotactile layer 102 to produce the same electrostatic force on the user's skin, which helps to reduce the power consumption of the electrotactile system. The configuration of FIG. 1b, unlike that of FIG. 1a, requires the electrotactile layer 204 and electrically insulating layer 103 to be substantially optically transparent, otherwise the user may be unable to see the underlying electronic display 101. In both configurations, however, one or more of the layers (electronic display 101, electrically insulating layer 103 and electrotactile layer 102) may be made from a stretchable and/or flexible material.

Touchscreen interfaces are electronic visual displays which can detect the presence and location of a touch input within the display area. The term "touchscreen" generally refers to interfaces which interact with a user's finger, but most technologies can also sense other passive objects, such as a stylus. The touchscreen has two main attributes. Firstly, it enables a user to interact directly with what is displayed, rather than indirectly via an onscreen pointer. Secondly, it removes the need for any intermediate input device, such as a mouse or touchpad, which would otherwise be required for controlling the onscreen pointer.

A variety of different touchscreen technologies currently exist. One of these is capacitive touchscreen technology, which encompasses both self-capacitive systems and mutually-capacitive systems.

Figure 2A:
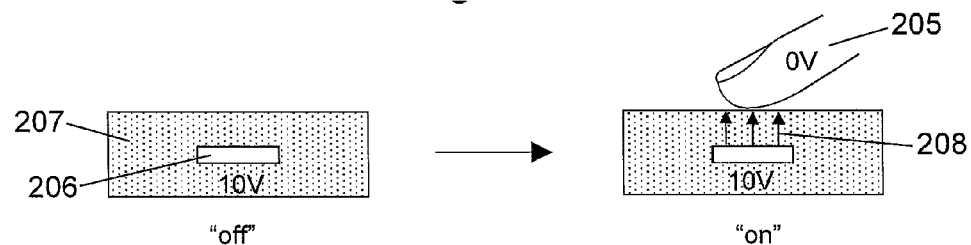
FIG. 2a shows the detection of a touch input by a self-capacitive touch sensor.
Figure 3A:
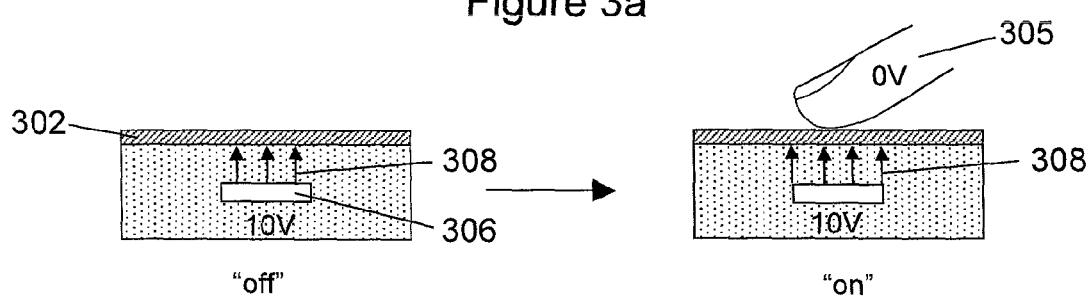
FIG. 3a shows how the presence of an electrotactile layer can hinder the detection of a touch input by a self-capacitive touch sensor.

A self-capacitive touch sensor (as illustrated in FIG. 2a) comprises an electrical conductor 206 (electrode) separated from the external environment by an electrical insulator 207. Like the electrotactile system, a potential (10V in the examples illustrated) is applied to charge the electrode 206. When the user's finger 205 or a stylus (which will usually be grounded) is brought into proximity of the charged electrode 206 (e.g. by touching the electrical insulator 207), opposite charges are induced on the finger/stylus 205 and an electric field 208 is formed therebetween (i.e. the electrode 206 couples capacitively to the user/stylus 205). The electrode 206 and the user/stylus 205 effectively serve as the opposite plates of a (dynamic) capacitor. Therefore, when the user/stylus 205 approaches the sensor, the total capacitance associated with the electrode 206 increases (typically by 1 fF-5 pF). This change in capacitance is then detected, and if the change exceeds a predetermined threshold value, the sensor interprets this as a touch input. As shown in FIG. 3a, the sensor changes from an "off" state (no touch input) to an "on" state (touch input detected).

Figure 2B:
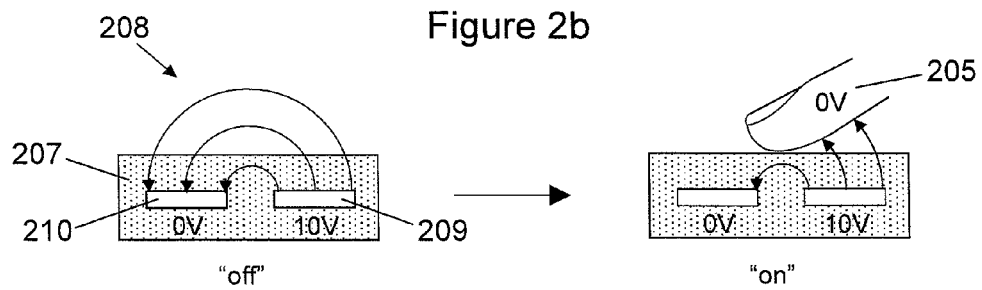
FIG. 2b shows the detection of a touch input by a horizontally-arranged mutually-capacitive touch sensor.

A mutually-capacitive touch sensor (as illustrated in FIG. 2b), however, comprises first 209 and second 210 electrical conductors (transmitter 209 and receiver 210 electrodes). A potential is then applied to charge the transmitter electrode 209, which generates an electric field 208 between itself and the receiver electrode 210. The transmitter 209 and receiver 210 electrodes effectively serve as the opposite plates of a capacitor, and the capacitance associated with the receiver electrode 210 is measured. In the example shown, the electrodes 209, 210 lie in the same plane (i.e. a horizontally-arranged mutually-capacitive sensor). In this configuration, the stray field lines 208 extend above the plane of the electrodes 209, 210 into the region external to the device. When the user's finger 205 or a stylus is brought into proximity of the sensor, the finger/stylus 205 interferes with the electric field 208 (i.e. the transmitter electrode 209 couples capacitively to the user/stylus 205). In this way, the capacitance associated with the receiver electrode 210 decreases (typically by 1 fF-5 pF). As with the self-capacitive touch sensor, the change in capacitance is detected. If the change exceeds a predetermined threshold value, the sensor interprets this as a touch input.

Figure 2C:
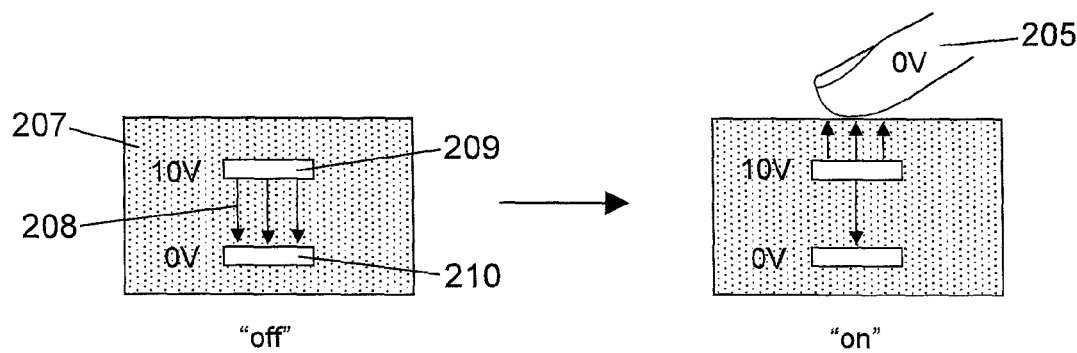
FIG. 2c shows the detection of a touch input by a vertically-arranged mutually-capacitive touch sensor.

To increase the resolution of a mutually-capacitive touch sensor array, the transmitter 209 and receiver 210 electrodes of each sensor may be arranged one on top of the other (i.e. a vertically-arranged mutually-capacitive sensor). This arrangement is illustrated in FIG. 2c. In this configuration, the user's finger/stylus 205 couples capacitively to the transmitter electrode 209 (similar to the electrode 206 of a self-capacitive sensor), causing a decrease in the capacitance associated with the receiver electrode 210.

By using an array of capacitive touch sensors, it is possible to pin-point the position of touch by averaging the signals from multiple sensors. This is useful when the touch input lies between adjacent sensors or spans multiple sensors. Whilst this allows the detection of touch inputs which lie between adjacent sensors, the detection tends to be more accurate when the position of touch coincides with the position of a sensor. For this reason, a greater density of sensors is usually advantageous.

As mentioned briefly in the background section, the integration of capacitive touchscreen and electrotactile technology presents various technical challenges. These must be addressed if these systems are to function properly in the same electronic display.

FIG. 3a illustrates the scenario where an electrotactile system is integrated with self-capacitive touchscreen technology. As discussed above, an alternating voltage is applied to the electrotacile layer 302 when haptic feedback is required, and removed again when haptic feedback is not required. When the alternating voltage is not being applied, the electrotactile layer 302 may be grounded or floating. There are therefore moments in time when a potential difference exists between the capacitive touch sensors and the electrotactile layer 302. In the examples illustrated, the electrotactile layer 302 is at a floating potential (when the electrotactile layer is in the "off" state) and the capacitive touch sensor electrodes are held at 10V. The potential difference results in capacitive cross-coupling between the capacitive touch sensor electrodes and the electrotactile layer 302, which is represented by electric field lines 308 in the figures.

Capacitive cross-coupling may prevent the detection of a touch input by the sensors. This is because the electrotactile layer 302 forms a capacitor with the sensor electrode 306 (compare FIG. 3a with FIG. 2a). As a result, the capacitance associated with the electrode 306 is relatively large before a touch input has been provided. When the user's finger 305 (or stylus) is then brought into proximity of the sensor, the capacitance associated with the electrode 306 increases, but the difference in capacitance is reduced by the presence of the electrotactile layer 302. This is depicted by an increase of one field line in FIG. 3a compared to an increase of three field lines in FIG. 2a. It is therefore more difficult for the system to distinguish between the "on" state and the "off" state as a result of the electrotactile layer 302.

Figure 3B:
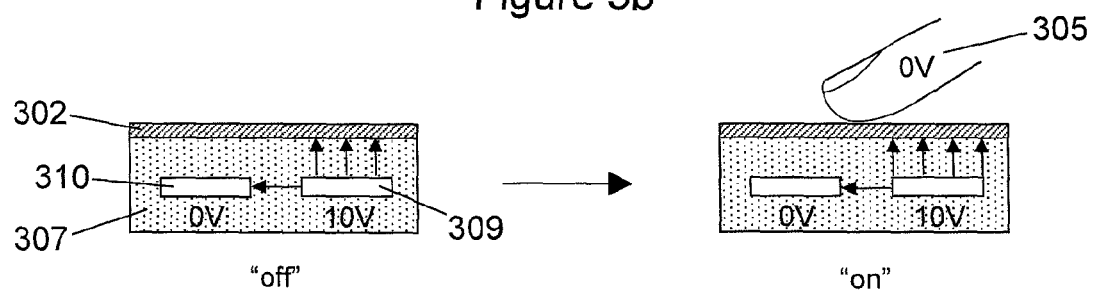
FIG. 3b shows how the presence of an electrotactile layer can hinder the detection of a touch input by a horizontally-arranged mutually-capacitive touch sensor.

A similar scenario occurs when an electrotactile system is integrated with mutually-capacitive touch sensors. FIG. 3b shows a horizontally-arranged sensor whilst FIG. 3c shows a vertically-arranged sensor. In FIG. 3b, the stray field lines, which would normally extend beyond the electrical insulator 307, are intercepted by the electrotactile layer 302. As a result, the capacitance associated with the receiver electrode 310 is relatively small before a touch input has been provided. When the user's finger 305 (or stylus) is then brought into proximity of the sensor, the capacitance associated with the transmitter electrode 309 increases, but the decrease in capacitance associated with the receiver electrode 310 (which is used to determine whether or not a touch input has occurred) is negligible. This is depicted by a single field line between the transmitter 309 and receiver 310 electrodes before and during the touch input. The electrotactile layer has a similar effect on the vertically-arranged sensor of FIG. 3c.

Figure 4C:
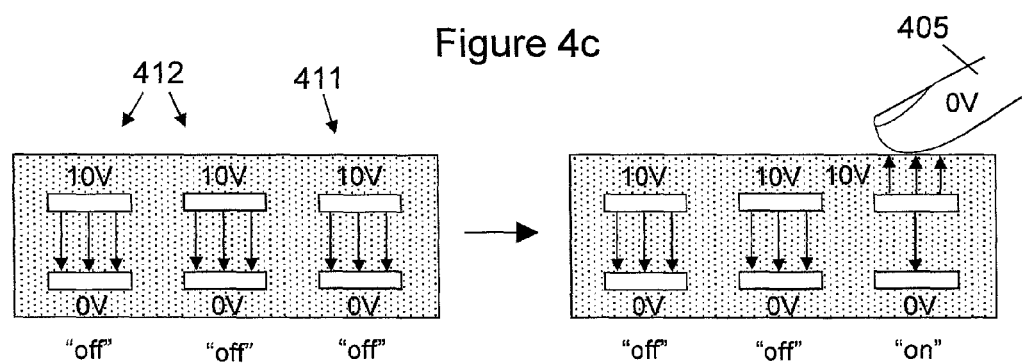
FIG. 4c shows a plurality of vertically-arranged mutually-capacitive touch sensors.

Capacitive cross-coupling can also lead to accidental triggering of other sensors 412 in the array when a touch input is applied to a first sensor 411. FIGS. 4a-4c illustrate how a plurality of touch sensors 411, 412 should operate under normal conditions (i.e. in the absence of an electrotactile layer). In FIG. 4a, the user's finger/stylus 405 causes an increase in capacitance at one of the self-capacitive sensors 411, but not the others 412. As a result, the system detects a touch input at this sensor 411 only (i.e. the state switches from "off" to "on"). A similar scenario occurs with the mutually-capacitive touch sensors in FIGS. 4b and 4c, where the user's finger/stylus reduces the capacitance at the receiver electrode 410 of the right-hand sensor 411 but not at the receiver electrode 410 of the other sensor(s) 412.

Figure 5A:
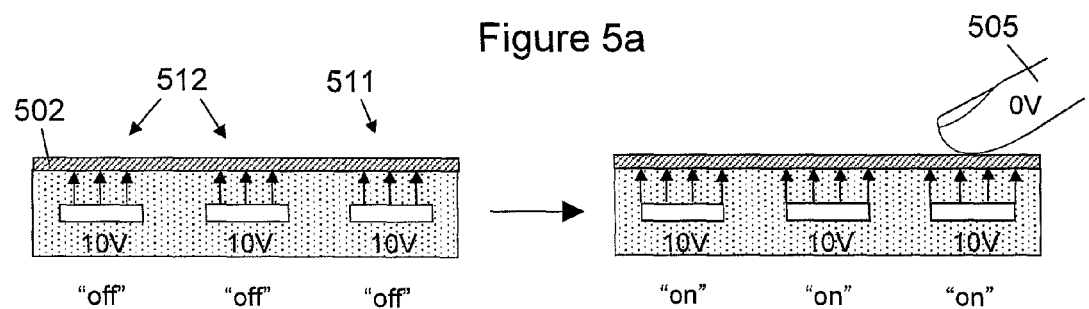
FIG. 5a shows how an electrotactile layer can cause accidental triggering of self-capacitive touch sensors.
Figure 5B:
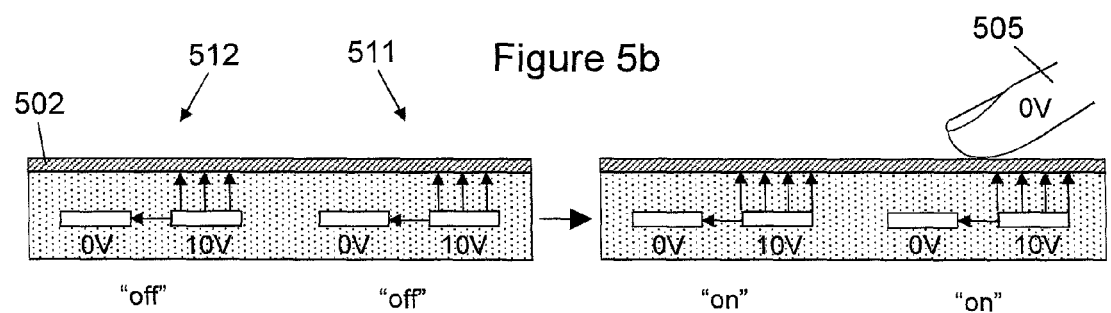
FIG. 5b shows how an electrotactile layer can cause accidental triggering of horizontally-arranged mutually-capacitive touch sensors.
Figure 5C:
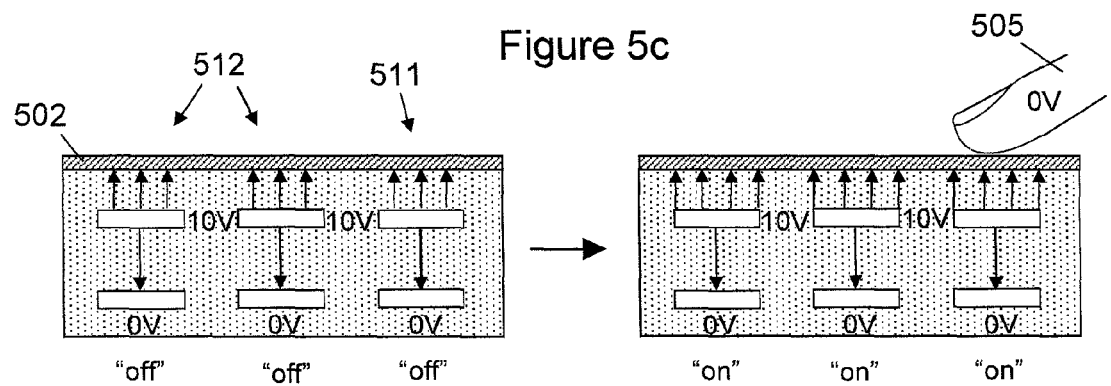
FIG. 5c shows how an electrotactile layer can cause accidental triggering of vertically-arranged mutually-capacitive touch sensors.

FIGS. 5a-5c illustrate the effect of adding an electrotactile layer 502 to each of the different sensor arrays. When the user's finger/stylus 505 is brought into proximity of the right-hand sensor 511 in each case, the capacitance associated with this sensor 511 varies as expected. However, since each of the sensors 511, 512 are cross-coupled to the electrotactile layer 502, the capacitance associated with the other sensors 512 also varies. In this way, a single touch input applied to one sensor 511 can also affect the state of the other sensors 512 (i.e. each sensor switches from the "off" state to the "on" state). In a touchscreen device, this problem may manifest itself as unintentional selection of onscreen content.

Another problem encountered when capacitive touchscreen and electrotactile technology is integrated within the same device is that the electrotactile layer can induce charges on the capacitive touch sensors when the electrotactile layer is in the "on" state (i.e. when a potential is applied to the electrotactile layer to provide haptic feedback).

Figure 6:
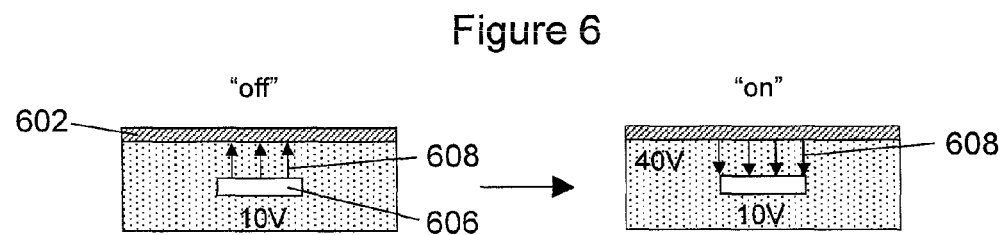
FIG. 6 shows how an electrotactile layer can prevent the detection of a touch input by capacitive touch sensor, and even damage the measurement circuit of a capacitive touch sensor.

FIG. 6 shows the capacitive cross-coupling between the electrotactile layer 602 and a self-capacitive touch sensor 606 when the electrotactile layer 602 is in the "off" state and "on" state, respectively. In the "off" state, the electrotactile layer 602 is at a floating potential which is less than the potential applied to the underlying sensor 606 (10V in this example). In this configuration, the sensor 606 induces charge on the electrotactile layer 602 as a result of the capacitive cross-coupling (illustrated by the electric field lines 608 from the sensor 606 to the electrotactile layer 602).

When the electrotactile layer 602 is in the "on" state, however, a potential (40V in this example) is applied to the electrotactile layer 602 to provide haptic feedback to a user, which is typically greater than the potential applied to the underlying sensor 606 (10V in this example). In this configuration, the electrotactile layer 602 induces charge on the sensor 606 as a result of the capacitive cross-coupling (illustrated by the electric field lines 608 from the electrotactile layer 602 to the sensor 606). As a result of this charge transfer, the sensor 606 is incapable of inducing charge on a finger/stylus and therefore detecting a touch input. Furthermore, as a result of the large potential applied to the electrotactile layer 602 (relative to that applied to the sensor 606), the magnitude of charge induced on the sensor 606 can potentially damage the integrated circuit (IC) of the capacitive touch sensor 606. The same problems exist when horizontally or vertically arranged mutually-capacitive touch sensors (shown in FIGS. 2b and 2c) are used instead of self-capacitive touch sensors 606.

The present apparatus addresses the above-mentioned issues by using the same electrode(s) for detecting touch inputs and for providing haptic feedback. In other words, the electrodes which form the capacitive touch sensors also double as electrotactile elements. By using the sensor electrodes to provide haptic feedback, there is no additional conductive layer in proximity to the electrodes, and therefore no capacitive cross-coupling. Since only one set of electrodes is required, a device comprising this apparatus may be less complicated and less expensive to manufacture than those comprising separate sensor and electrotactile components. Furthermore, because each layer of material increases the rigidity of the apparatus, removing the need for a separate electrotactile layer is useful when the apparatus is to be incorporated into a flexible touchscreen, as it enables the thickness of the other layers to be increased for improved durability without preventing flexing of the touchscreen.

To achieve this functionality, each electrode is configured to be placed in a first or second state such that, in the first state, the electrode is configured for the detection of a touch input, and in the second state, the electrode is configured for the provision of haptic feedback. The electrode may be placed in the second state whenever haptic feedback is required, and be placed in the first state whenever haptic feedback is not required.

Figure 7A:
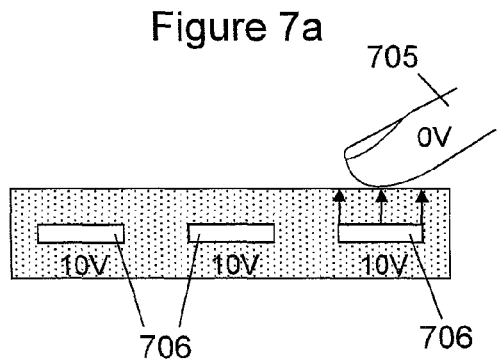
FIG. 7a shows an array of electrodes functioning as self-capacitive touch sensors.
Figure 7B:
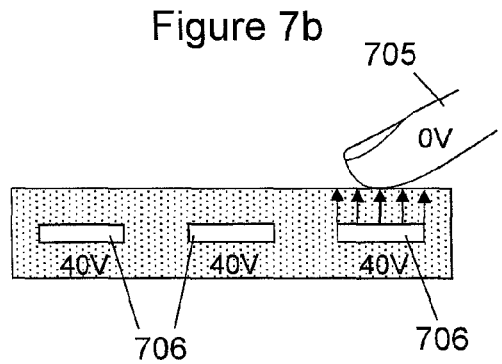
FIG. 7b shows the array of electrodes of FIG. 7a functioning as electrotactile elements.

FIG. 7a shows an array of electrodes 706 operating as self-capacitive touch sensors (i.e. placed in the first state). In this state, a potential (10V in this example) is applied to the electrodes 706. When a user's finger/stylus 705 is brought into proximity of an electrode 706, it couples capacitively to the electrode 706 causing a variation in the electrode capacitance. If the change in capacitance is above a predetermined threshold value, a touch input is registered. FIG. 7b shows the same array of electrodes 706 shown in FIG. 7a operating as electrotactile elements (i.e. placed in the second state). In this state, an electrotactile signal is applied to the electrodes 706. As will be described in more detail with reference to FIG. 10, the electrotactile signal consists of a series of voltage pulses (i.e. a periodic potential). Typically, the voltage pulses have amplitudes (40V in this example) greater than the voltage applied to a capacitive touch sensor (10V in this example). When the user's finger/stylus 705 is in proximity to an electrode 706, the voltage pulses create vibrations in the finger/stylus 705 which are felt by the user.

Similar functionality may be achieved using the transmitter electrodes 809, 909 of a horizontally or vertically arranged mutually-capacitive touch sensor as shown in FIGS. 8 and 9, respectively. In FIGS. 8a and 9a, a potential of 10V is applied to the transmitter electrode 809, 909 of each sensor whilst the receiver electrode 810, 910 is grounded. As described previously, the transmitter electrode 809, 909 couples capacitively to the receiver electrode 810, 910 (illustrated by the electric field lines 808, 908 extending therebetween). When a user's finger/stylus 805, 905 is in proximity to a sensor, it couples capacitively to the transmitter electrode 809, 909 causing a variation in the receiver electrode capacitance. As with self-capacitive touch sensors, the change in capacitance is registered as a touch input if it exceeds a predetermined threshold value. On the other hand, when the transmitter electrode 809, 909 of each sensor is placed in the second state, a periodic potential is applied to the transmitter electrode 809, 909 to generate vibrations in the user's finger/stylus 805, 905 (FIGS. 8b and 9b).

In the examples shown in FIGS. 7b-9b, the 40V electrotactile signal is applied to each electrode 706 in the array (each transmitter electrode 809, 909 in FIGS. 8*b* and 9*b*). In some situations, however, this may be unnecessary. For example, haptic feedback may be provided in response to the detection of a touch input as a confirmation that said touch input has been detected. In this scenario, the electrotactile signal need only be applied to the electrode that detected the touch input (i.e. the right-hand electrode in FIGS. 7*b*-9*b*). Providing the electrotactile signal to the other electrodes therefore unnecessarily increases the power consumption of the system. To address this issue, each electrode may be independently controlled such that the state of one electrode is independent of the state of the other electrodes. In this way, one electrode may be used to provide haptic feedback whilst the other electrodes are being used to detect touch inputs. This feature is not absolutely necessary, however, and the electrodes may be configured to be placed in the same state at the same time, if required.

FIG. 10 shows an example of a typical electrotactile signal. The signal comprises a train of short, sharp pulses 1013 (with an amplitude $V_0$ and a typical duration $t_1$ of 10-50 µs) which are grouped together to form a basic pulse 1014 (with an amplitude $V_0$ and a typical duration $t_2$ of 0.5-2 ms). The frequency of the basic pulses 1014 is what determines the perceived frequency of vibration in the haptic feedback.

Measurement circuits for existing capacitive touch sensor arrays are capable of scanning the array (to determine whether a touch input has been applied or not) at a frequency of up to 1200 Hz, possibly higher. Therefore, if the frequency of the basic electrotactile pulses 1014 is set to 10-500 Hz, there is a sufficient time window T for the measurement circuit to detect a touch input between voltage pulses. For example, if the basic electrotactile pulses 1014 have a frequency of 10 Hz, the measurement circuit could scan the electrodes up to 120 times in the time period (T). In this way, as well as being used to detect touch inputs whenever haptic feedback is not required, the electrodes may also be used to detect touch inputs intermittently during times when haptic feedback is required. To achieve this, the state of those electrodes being used to provide haptic feedback would need to be alternated periodically during this time.

Figure 11A:
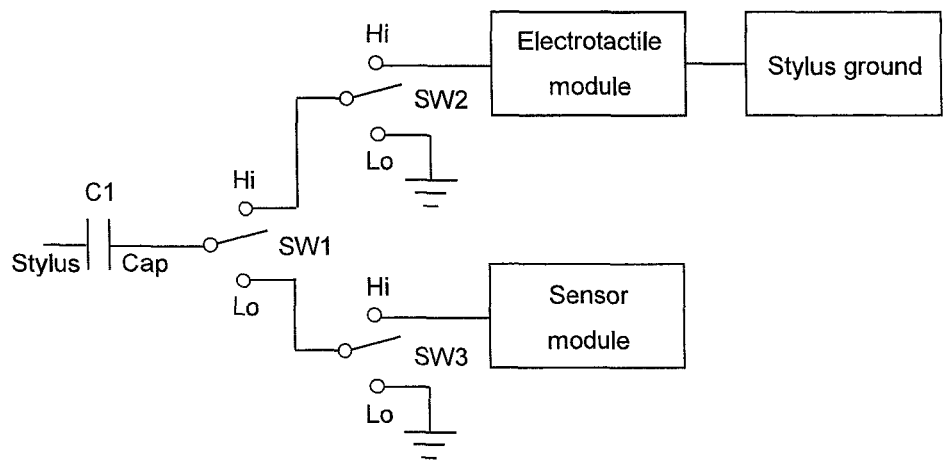
FIG. 11a shows how a series of switches can be used to change the function of an electrode of a self-capacitive touch sensor.

The state of each electrode may be controlled using a plurality of switches. FIG. 11*a* shows one possible circuit diagram for a device comprising an electrode which functions both as a self-capacitive touch sensor and as an electrotactile element. The electrode (Cap) forms a capacitor (C1) with a user's finger/stylus, and the circuit comprises three switches (SW1-SW3) which are operated simultaneously as follows:

To place the electrode in the first state, switches SW1, SW2 and SW3 are set to "low", "low", and "high", respectively (although switch SW2 could be left floating rather than being grounded). In this configuration, the electrode is connected to a sensor module. The sensor module comprises a sensor power supply, a sensor control circuit, and a sensor measurement circuit, and is used to operate the electrode as a sensor. The sensor power supply is configured to apply a voltage to the electrode, the sensor control circuit is configured to control the voltage applied to the electrode, and the sensor measurement circuit is configured to measure the capacitance of the electrode and determine whether or not a touch input has occurred (e.g. by comparing the measured capacitance or measured change in capacitance with a predetermined threshold value).

To place the electrode in the second state, switches SW1, SW2 and SW3 are set to "hi", "hi", and "low", respectively (although switch SW3 could be left floating rather than being grounded). In this configuration, the electrode is connected to an electrotactile module. The electrotactile module comprises an electrotactile power supply, an electrotactile control circuit, and a stylus ground, and is used to operate the electrode as an electrotactile element. The electrotactile power supply is configured to apply a voltage to the electrode, the electrotactile control circuit is configured to control the voltage applied to the electrode (e.g. the amplitude, frequency, duration and/or polarity of the electrotactile signal), and the stylus ground is configured to ground the user/stylus when the user/stylus is in proximity to the electrode. The stylus ground is not absolutely necessary in order to feel the haptic feedback (because the user will act as a ground), but it may enhance the sensation.

It may be necessary (or at least advantageous) to discharge the electrode between states, otherwise residual charge on the electrode from the previous operation might adversely affect the performance of the electrode during the subsequent operation. For example, if the electrode was previously being used to provide haptic feedback then it may comprise a large amount of surface charge as a result of the (relatively large) voltage that was applied to the electrode by the electrotactile power supply. If the electrode is then required to function as a capacitive touch sensor, the capacitance of the electrode may exceed the measuring range of the sensor measurement circuit as a result of the surface charge, which could potentially damage the measurement circuit. To discharge the electrode, switches SW1, SW2 and SW3 may each be set to "low". In this configuration, the electrode is connected to ground.

Figure 11B:
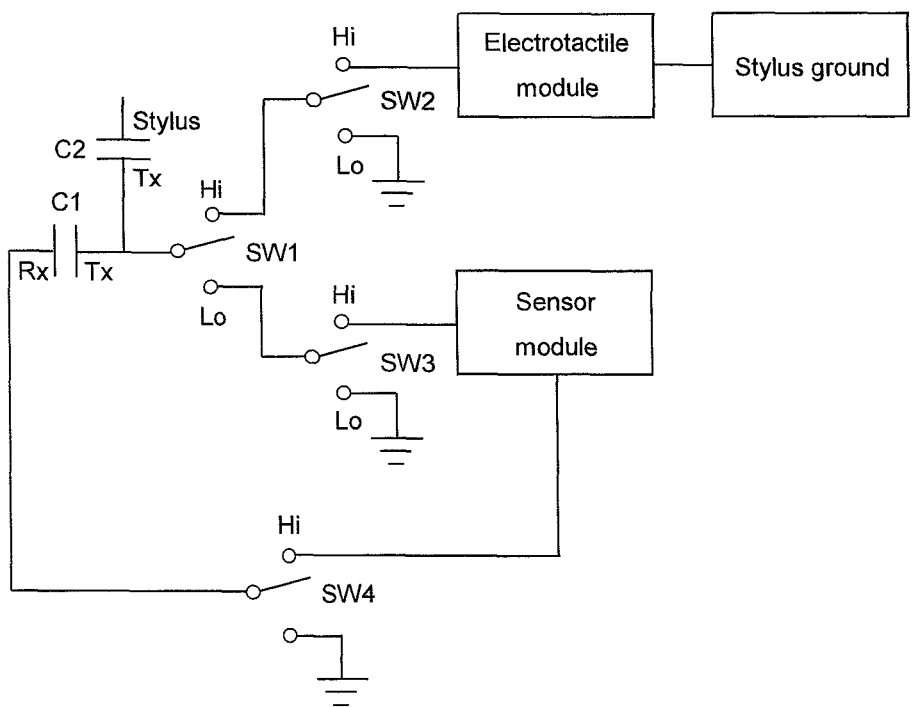
FIG. 11b shows how a series of switches can be used to change the function of an electrode of a mutually-capacitive touch sensor.
Figure 12A:
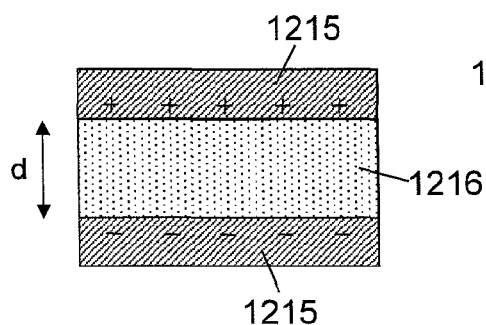
FIG. 12a shows a parallel plate capacitor in cross-section.
Figure 12B:
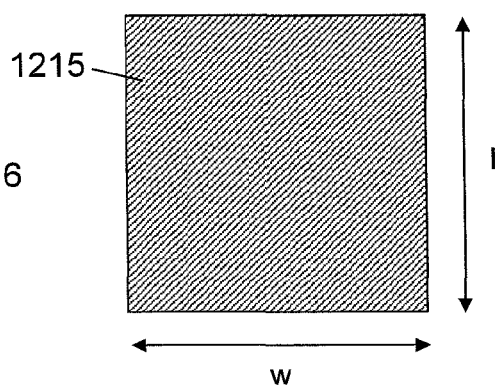
FIG. 12b shows a parallel plate capacitor in plan view.

FIG. 11*b* shows a similar circuit diagram for a device comprising an electrode which functions both as the transmitter electrode of a mutually-capacitive touch sensor, and as an electrotactile element. In this case, the electrode (Tx) forms one capacitor (C1) with a receiver electrode (Rx) of the sensor, and another capacitor (C2) with the user's finger/stylus. The circuit comprises four switches (SW1-SW4) which are operated simultaneously as follows:

To place the electrode in the first state, switches SW1 and SW2 are set to "low", and switches SW3 and SW4 are set to "hi" (although switch SW2 could be left floating rather than being grounded). In this configuration, the electrode is connected to a sensor module (described above). To place the electrode in the second state, switches SW1 and SW2 are set to "hi", and switches SW3 and SW4 are set to "low" (although switches SW3 and SW4 could be left floating rather than being grounded). In this configuration, the electrode is connected to an electrotactile module (described above). In order to discharge the electrode between states, switches SW1-SW4 may each be set to "low". This latter configuration also causes the receiver electrode (Rx) to discharge.

The circuit diagrams of FIGS. 11*a* and 11*b* show connections to a single sensor. However, the same principles may be applied to an array of sensors. This can be accomplished by multiplexing (not shown) the connection between switch SW1 and the electrode (Cap) in FIG. 11*a*, and by multiplexing (not shown) the connection between switch SW1 and the transmitter electrode (Tx), and the connection between switch SW4 and the receiver electrode (Rx), in FIG. 11*b*.

Generally speaking, the capacitance of a parallel plate capacitor (shown in cross-section and plan view in FIGS.

12a and 12b, respectively) comprising two electrically conductive plates 1215 separated by a dielectric material 1216 is given by $$C = \epsilon_0 \epsilon_r A/d \qquad \text{Equation 1}$$

where $\epsilon_0$ is the permittivity of free space, $\epsilon_r$ is the relative permittivity of the dielectric material, A (w×l) is the area of each plate 1215, and d is the thickness of the dielectric material 1216. Also, the power consumption (P) associated with such a capacitor is given by $$P = V_d^2 fC \qquad \text{Equation 2}$$

where $V_d$ is the potential difference between the two plates 1215, f is the frequency of operation, and C is the capacitance.

Figure 13A:
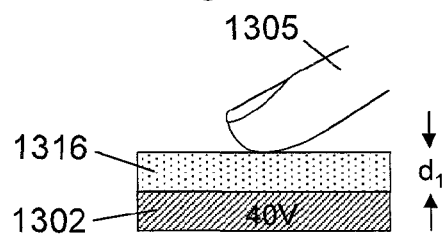
FIG. 13a shows a layer of electrically insulating material on top of an electrode of an electrotactile system.

The thickness, $d_1$, of the electrically insulating material 1316 used to separate the electrode 1302 of an electrotactile system (FIG. 13a) and the user's finger/stylus 1305 must be small enough to enable detectable vibrations in the user's finger/stylus 1305 to be generated. In general, the thickness of the electrically insulating material 1316 must be decreased if the applied potential is decreased. In order to generate detectable vibrations in the user's finger/stylus 1305 at 40V, the electrode 1302 and finger/stylus 1305 must be separated by an electrically insulating material 1316 with a thickness on the order of 1 μm or less.

Figure 13B:
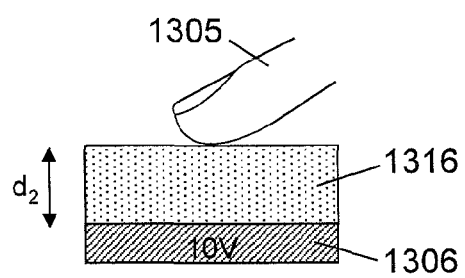
FIG. 13b shows a layer of electrically insulating material on top of an electrode of a capacitive touch sensor array.

In contrast, the electrodes 1306 of existing capacitive touch sensors are typically spaced from the user's finger/stylus 1305 (FIG. 13b) by an electrically insulating material 1316 with a thickness on the order of 1 mm or greater. This is because the sensor measuring circuit has an upper limit on the capacitance that can be detected.

Since the electrodes of the present apparatus are being used as capacitive touch sensors and as electrotactile elements, the thickness of the electrically insulating material is an important consideration. On one hand, if the insulator has a thickness on the order of 1 mm, the voltage of the electrotactile signal must be dramatically increased otherwise the electrode will be unable to produce vibrations in the user's finger/stylus which are detectable by the user. However, this would dramatically increase the power consumption of the device, which may be unacceptable for some portable electronic devices. On the other hand, if the insulator has a thickness on the order of 1 μm, the capacitance associated with the electrode will increase beyond the limit of existing sensor measurement circuits, and may even damage the measurement circuit.

Figure 14A:
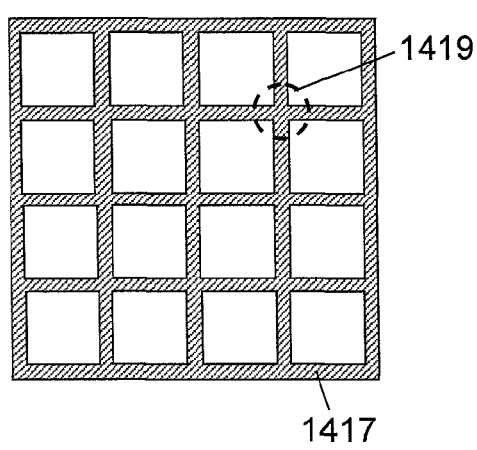
FIG. 14a shows how a mesh of material can be used to form a plurality of electrodes.
Figure 14B:
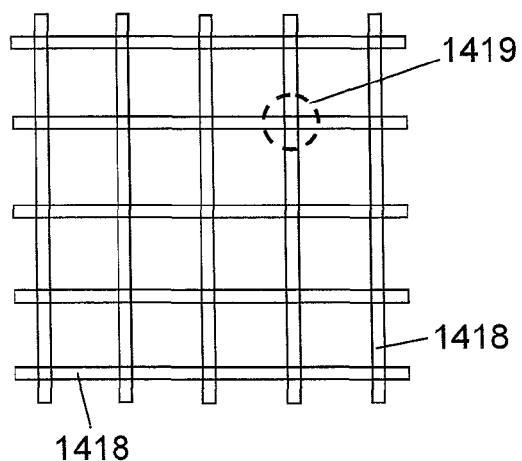
FIG. 14b shows how intersecting strips of material can be used to form a plurality of electrodes.

To address this issue, the upper surface area (A) of the electrodes may be reduced such that the capacitance of the electrodes can be kept within the range of the sensor measuring circuit even when the thickness of the insulator is less than 1 mm (given that the capacitance is proportional to the electrode area and inversely proportional to the thickness of the insulator according to Equation 1). In practice, this may be achieved by forming the electrodes from a mesh 1417 of material (FIG. 14a) or from a plurality of intersecting strips 1418 of material (FIG. 14b). With this configuration, the electrodes are formed at the junctions of the mesh/strips (as highlighted by the dashed circles 1419), and the widths of the strips 1417, 1418 are chosen to minimise the area of each junction (and therefore electrode). The vertical strips of this configuration also serve as the drive lines used to carry current to and from the sensor electrodes, whilst the horizontal strips serve as the sense lines used to read out the state of each electrode.

The widths of the strips 1417, 1418 will also depend on the materials used to form the strips, and the (node) capacitance between the drive and sense lines (which will typically be between 0.05 Pf and 2 Pf). Calculations have shown, for example, that for a 1 μm thick layer of insulator (with a dielectric permittivity of 3) and a node capacitance of 0.6 pF, a strip width of 150 μm is acceptable. However, this width would be too small to carry the electrical signals if a material with high sheet resistivity (such as indium tin oxide) was used. On the other hand, if copper was used to form the strips 1417, 1418, this width would be too large because the strips 1417, 1418 would be visible to the human eye (which is unsuitable for touch sensitive displays in which the electrodes and drive/sense lines should be optically transparent to the user). A more appropriate width for copper would be 1-3 μm, which could be achieved by forming each strip 1417, 1418 as a sub-mesh.

The electrodes may be made from one or more of the following materials: gold, silver, copper, carbon, graphene, zinc oxide, indium tin oxide, and vanadium oxide. Furthermore, when a mesh or intersecting strips are used to form the electrodes, the mesh/strips may be made from a thin film of material, or from a network of nanowires, nanotubes or nanoribbons (e.g. silver, carbon, zinc oxide or graphene nanowires/nanotubes/nanoribbons).

The glaborous skin of the human hand is populated with mechanoreceptors for the detection of texture. The most densely populated regions of mechanoreceptors in the hand are the fingertips, which allow two objects to be differentiated when spaced only 1-2 mm apart. This is considered to be the maximum resolution of human fingertips for texture sensing, and therefore the absolute minimum spacing required by the electrodes of an electrotactile system (because it enables the simulation of all detectable textures). In this respect, the spacing between adjacent electrodes (i.e. the spacing between adjacent junctions when a mesh 1417 or intersecting strips 1418 are used) in the present apparatus may be at least 1 mm (i.e. a smaller spacing provides no advantage in relation to haptic feedback).

It will be appreciated that physical contact between the user's finger/stylus and the device (e.g. touchscreen) may not necessarily be required to provide for touch input or haptic feedback. This is because the electrode couples capacitively to the finger/stylus via an electric field (i.e. action at a distance). Therefore, hovering the finger/stylus over the device may result in a touch input/haptic feedback. Also, the same power supply may be used to power the electrode (i.e. appropriately configured to provide the required voltages and perform the corresponding functions) when it is being used to detect touch input as well as when it is being used to provide haptic feedback.

Figure 15:
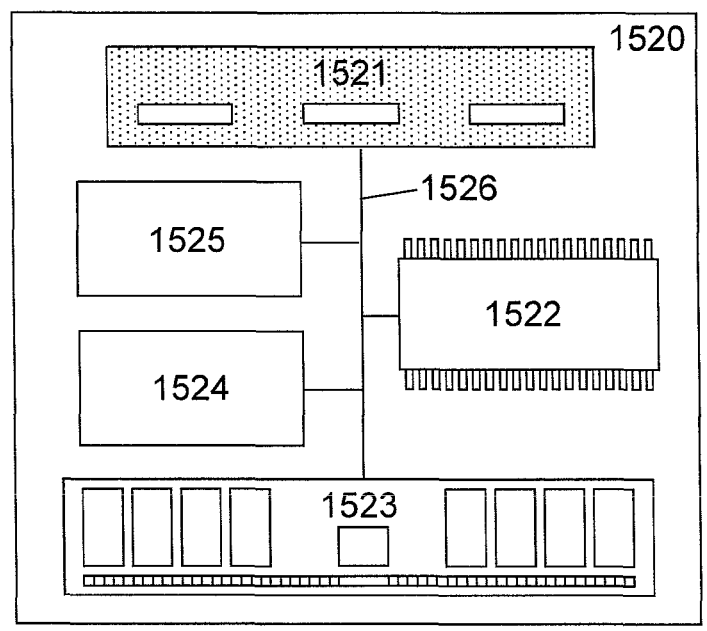
FIG. 15 shows a device comprising the apparatus described herein.

FIG. 15 illustrates schematically a device 1520 comprising the apparatus 1521 described herein. The device 1520 also comprises a processor 1522, a storage medium 1523, a sensor module 1524, and an electrotactile module 1525, which are electrically connected to one another by a data bus 1526. The device 1520 may be an electronic device, a portable electronic device, a portable telecommunications device, a touchscreen display for any of the aforementioned devices, or a module for any of the aforementioned devices.

The apparatus 1521, together with the processor 1522 and storage medium 1523, is configured to detect a touch input by a user of the device 1520 or provide haptic feedback to the user depending on the state of the electrode(s) as controlled by the apparatus. The haptic feedback may be in response to a detected touch input.

The processor 1522 is configured for general operation of the device 1520 by providing signalling to, and receiving signalling from, the other device components to manage their operation. In particular, the processor 1522 is configured to control the state of each electrode of the apparatus 1521 (e.g. by operating the switches as described previously). In other embodiments, the processor may be dedicated for control of the electrode states.

The sensor module 1524 comprises a sensor power supply, a sensor control circuit, and a sensor measurement circuit, and is used to operate the electrode as a sensor. The sensor power supply is configured to apply a voltage to the electrode, the sensor control circuit is configured to control the voltage applied to the electrode, and the sensor measurement circuit is configured to measure the capacitance of the electrode and determine whether or not a touch input has occurred (e.g. by comparing the measured capacitance or measured change in capacitance with a predetermined threshold value).

The electrotactile module 1525 comprises an electrotactile power supply, an electrotactile control circuit, and a stylus ground, and is used to operate the electrode as an electrotactile element. The electrotactile power supply is configured to apply a voltage to the electrode, the electrotactile control circuit is configured to control the voltage applied to the electrode (e.g. the amplitude, frequency, duration and/or polarity of the electrotactile signal), and the stylus ground is configured to ground the user/stylus when the user/stylus is in proximity to the electrode. The stylus ground is not absolutely necessary in order to feel the haptic feedback (because the user will act as a ground), but it may enhance the sensation.

The storage medium 1523 is configured to store computer code configured to perform, control or enable operation of the apparatus 1521. The storage medium 1523 may also be configured to store settings for the other device components. The processor 1522 may access the storage medium 1523 to retrieve the component settings in order to manage the operation of the other device components.

In particular, the storage medium 1523 may be configured to store the operation voltages of the electrodes for detecting touch inputs and for providing haptic feedback, and/or the predetermined capacitance thresholds for determining whether or not a touch input has been applied. The sensor 1524 and electrotactile 1525 modules may access the storage medium 1523 to retrieve the operation voltages. The sensor module 1524 may also compare the present capacitance of each sensor with the predetermined threshold to determine if a touch input has occurred. This may involve averaging the signals from multiple sensors to detect touch inputs that do not coincide with the position of a single sensor (e.g. the touch input lies between adjacent sensors or spans multiple sensors). In addition, the processor 1522 may run a corresponding piece of software (also stored in the storage medium 1523) in response to a detected touch input. The storage medium 1523 may be a temporary storage medium such as a volatile random access memory. On the other hand, the storage medium 1523 may be a permanent storage medium such as a hard disk drive, a flash memory, or a non-volatile random access memory.

Figure 16:
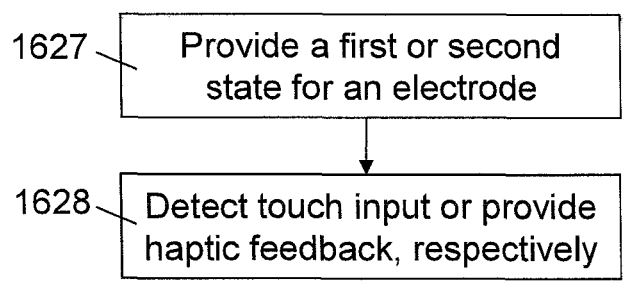
FIG. 16 shows a method of using the apparatus described herein.

The main steps 1627-1628 of the method used to operate the apparatus 1521 are illustrated schematically in FIG. 16.

Figure 17:
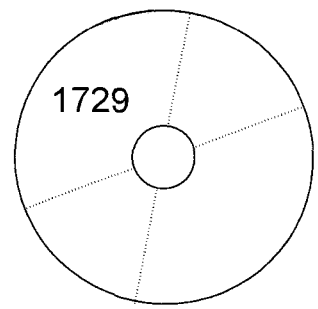
FIG. 17 shows a computer readable medium comprising a computer program for controlling the use of the apparatus described herein.

FIG. 17 illustrates schematically a computer/processor readable medium 1729 providing a computer program according to one embodiment. In this example, the computer/processor readable medium 1729 is a disc such as a digital versatile disc (DVD) or a compact disc (CD). In other embodiments, the computer/processor readable medium 1729 may be any medium that has been programmed in such a way as to carry out an inventive function. The computer/processor readable medium 1729 may be a removable memory device such as a memory stick or memory card (SD, mini SD or micro SD).

The computer program may comprise computer code configured to perform, control or enable the following: provision of a first state or a second state for an electrode, wherein in the first state, the electrode is configured for use in the detection of touch input, and in the second state, the electrode is configured for use in the provision of haptic feedback.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising at least one processor and at least one non-transitory memory including computer program code, the at least one non-transitory memory and the computer program code configured to, with the at least one processor, cause the apparatus at least to provide a first state or a second state in an electrode, with a single layer functioning both as the transmitter electrode of a mutually-capacitive touch sensor and as an electrotactile element, wherein in the first state, the electrode is configured for use in the detection of touch input, wherein in the second state, the electrode is configured for use in the provision of haptic feedback, wherein the electrode includes an upper surface area that is divided into a plurality of segments, configured to reduce capacitance of the electrode below a threshold level thereby staying within touch input measurement circuit limits, and wherein each segment further configured to provide a different amplitude of haptic feedback; and switch between providing the first state and providing the second state.

2. The apparatus of claim 1, wherein, in the first state, the electrode serves as part of a capacitive touch sensor, and wherein the apparatus is configured to provide the first state by applying a potential to the electrode and monitoring the capacitance associated with the capacitive touch sensor.

3. The apparatus of claim 2, wherein the electrode serves as part of a self-capacitive touch sensor, and wherein the apparatus is configured to provide the first state by applying a potential to the electrode and monitoring the capacitance of the electrode.

4. The apparatus of claim 2, wherein the electrode serves as a transmitter electrode of a mutually-capacitive touch sensor, and wherein the apparatus is configured to provide the first state by applying a potential to the transmitter electrode and monitoring the capacitance of a receiver electrode of the mutually-capacitive touch sensor.

5. The apparatus of claim 1, wherein the apparatus is configured to provide the second state by applying a periodic potential to the electrode and controlling one or more of the amplitude, frequency, duration and polarity of the periodic potential.

6. The apparatus of claim 1, wherein the apparatus is configured to discharge the electrode between providing the first state and providing the second state, and/or between providing the second state and providing the first state.

7. The apparatus of claim 1, wherein the apparatus is configured to provide the second state when haptic feedback is required, and provide the first state when haptic feedback is not required.

8. The apparatus of claim 1, wherein the apparatus is configured to provide the second state in response to a touch input being detected to provide haptic feedback associated with the touch input.

9. The apparatus of claim 1, wherein the apparatus is configured to repeatedly switch between providing the first state and providing the second state during a period when touch input is required to be detected.

10. The apparatus of claim 1, wherein the apparatus is configured to repeatedly switch between providing the first state and providing the second state during a period when haptic feedback is required to be provided.

11. The apparatus of claim 1, wherein the apparatus is configured to switch between providing the first state and providing the second state using one or more switches.

12. The apparatus of claim 11, wherein, in the first state, the one or more switches connect the electrode to, a sensor module, and in the second state, the one or more switches connect the electrode to an electrotactile module.

13. The apparatus of claim 12, wherein the sensor module comprises one or more of a sensor power supply, a sensor control circuit and a sensor measurement circuit, and the electrotactile module comprises one or more of an electrotactile power supply, an electrotactile control circuit and a stylus ground.

14. The apparatus of claim 1, wherein the apparatus is configured to provide a first state or a second state for each electrode of a plurality of the electrode, wherein in the first state, each of the electrodes are configured for use in the detection of touch input, and in the second state, each of the electrodes are configured for use in the provision of haptic feedback.

15. The apparatus of claim 1, wherein the apparatus comprises the electrode.

16. The apparatus of claim 1, wherein the electrode is formed by the junction of two or more intersecting strips of material.

17. The apparatus of claim 1, wherein the apparatus is one of the following: an electronic device, a portable electronic device, a portable telecommunications device, a touchscreen display for any of the aforementioned devices, and a module for any of the aforementioned devices.

18. A device comprising the apparatus of claim 1.

19. A method comprising:
provinding a first state or a second state in an electrode, with a single layer functioning both as the transmitter electrode of a mutually-capacitive touch sensor and as an electrotactile element,
wherein in the first state, the electrode is configured for use in the detection of touch input,
wherein in the second state, the electrode is configured for use in the provision of haptic feedback, providing a different amplitude of haptic feedback, and
wherein the electrode includes an upper surface area that is divided into a plurality of respective segments to keep capacitance of the electrode below a threshold level thereby staying within touch input measurement circuit limits, and for providing the different amplitudes of haptic feedback; and
switching between providing the first state and providing the second state.

20. A computer program product, embodied on a non-transitory computer-readable medium in which a computer program is stored that, when being executed by a computer, is configured to provide instructions to perform the method of claim 19.

21. The apparatus of claim 1, where the apparatus comprises an electrically insulating material on top of the electrode, and the electrically insulating material has a thickness of the order of 1 μm or less.

* * * * *